United States Patent [19]

Kawamura

[11] Patent Number: 5,483,205
[45] Date of Patent: Jan. 9, 1996

[54] LOW POWER OSCILLATOR

[75] Inventor: J. Patrick Kawamura, Dallas, Tex.

[73] Assignee: Texas Instruments Incorporated, Dallas, Tex.

[21] Appl. No.: 369,945

[22] Filed: Jan. 9, 1995

[51] Int. Cl.$^6$ .............................. H03B 5/24; H03K 5/003
[52] U.S. Cl. .................. 331/74; 331/46; 331/57; 331/75; 331/108 C; 331/182; 331/185; 327/333; 327/534; 327/537
[58] Field of Search .................. 331/46, 57, 74, 331/75, 111, 108 C, 150, 182, 185, 186, DIG. 3; 327/333, 530, 534–537, 544, 548

[56] References Cited

U.S. PATENT DOCUMENTS

| | | | |
|---|---|---|---|
| 3,916,430 | 10/1975 | Heuner et al. | 327/333 X |
| 4,336,466 | 6/1982 | Sud et al. | 331/108 C X |
| 5,304,859 | 4/1994 | Arimoto | 331/46 X |
| 5,315,166 | 5/1994 | Arimoto | 331/46 X |

OTHER PUBLICATIONS

Takashima et al, "Low Power On–Chip Supply Voltage Conversion Scheme", *IEEE 1992 Symposium on VLSI Circuits Digest of Technical Papers*, Jun. 2, 1992; pp. 114–115.
Takashima et al, "Low–Power On–Chip Supply Voltage Conversion Scheme for Ultrahigh–Density DRAMs", *IEEE Journal of Solid–State Circuits*, vol. 28, No. 4, Apr. 1993; pp. 504–508.
Hiraki et al, "Data–Dependent Logic Swing Internal Bus Architecture for Ultra–Low Power LSis" *IEEE 1994 Symposium on VLSI Circuits Digest of Technical Papers*; Jun. 1994; pp. 29–30.
Yasuho, Hideo; "Part 1", *1994 Nikkei Microdevices*; Jul. 1994; pp. 32–34.
Itoh, Motoyasu; "Part 2"; *1994 Nikkei Microdevices*; Jul. 1994; pp. 35–38.

*Primary Examiner*—David Mis
*Attorney, Agent, or Firm*—Robert N. Rountree; Richard B. Havill; Richard L. Donaldson

[57] ABSTRACT

An oscillator circuit (150) is designed with a reference circuit (102), responsive to a first voltage, for producing a second voltage. An oscillator (108), responsive to the second voltage, produces a first output signal having a magnitude less than a magnitude of the first voltage. A level translator (114), responsive to the first output signal, produces a second output signal having a magnitude greater than the magnitude of the first output signal. Since the oscillator produces the first output signal with a magnitude less than the magnitude of the first voltage, power consumption is reduced with respect to an oscillator operating at the first voltage. The magnitude of the first output signal is increased by the level translator to a desired magnitude of the second output signal.

35 Claims, 2 Drawing Sheets

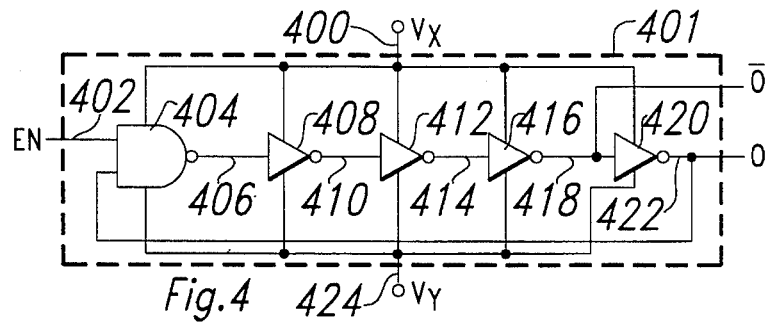
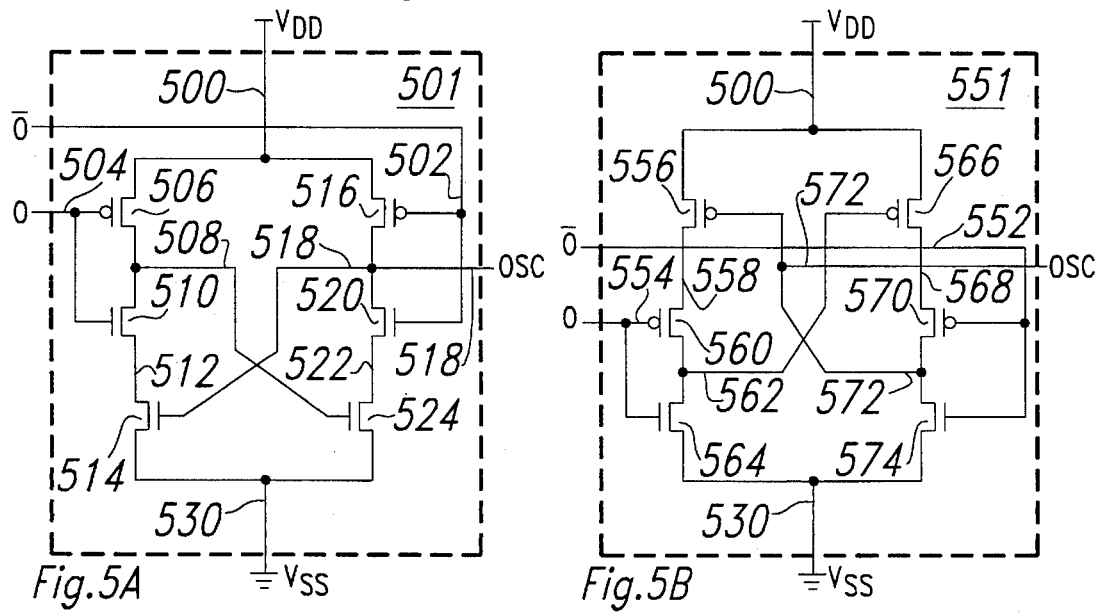
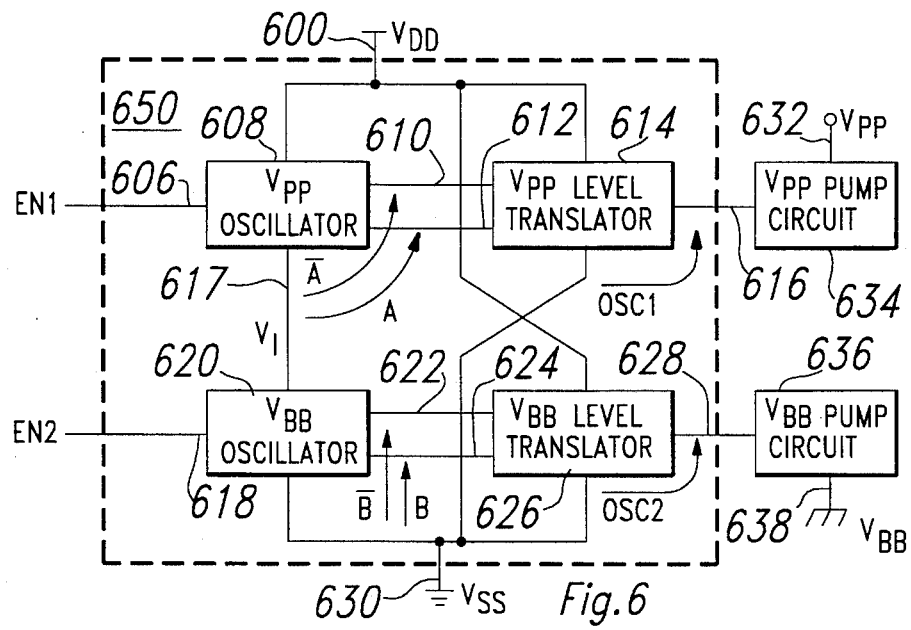

5,483,205

LOW POWER OSCILLATOR

FIELD OF THE INVENTION

This invention relates to an integrated circuit and more particularly to an integrated circuit including an oscillator.

BACKGROUND OF THE INVENTION

Present complementary metal oxide semiconductor (CMOS) dynamic random access memory (DRAM) circuits are frequently used for main memory in a variety of applications including desk top and portable computer systems. The extensive use of dynamic random access memory circuits for low power applications requires low standby power consumption to prolong system battery life. The trend in dynamic random access memory design is to minimize power consumption of circuits such as reference supplies and bias circuit oscillators which operate during standby mode.

Previous memory circuits have employed reference circuits as disclosed in U.S. Pat. No. 5,208,776, entitled PULSE GENERATION CIRCUIT and issued to Nasu et al (FIG. 90) to reduce power consumption. Previous oscillator circuits used power saving techniques, as disclosed by Nasu et al in the oscillator (FIG. 112) and block diagram (FIG. 182a), that include a separate low power oscillator dedicated to standby operation. Such oscillator circuits may be used in dynamic random access memory circuits to drive substrate pump circuits, as shown by Nasu et al (FIG. 113). Nasu et al also disclose the use of a regulated internal supply voltage VPERI (FIG. 87), which is derived from an external supply voltage VEXT. The oscillator (FIG. 112) operates at the supply voltage VPERI to produce an output signal for driving the pump circuit of FIG. 113. Power consumed by the oscillator is equal to the product of internal supply voltage VPERI and current consumed by the oscillator. Thus, power consumption by the oscillator is reduced, because the magnitude of internal supply voltage VPERI is less than the magnitude of external supply voltage VEXT. However, a problem with this method is that pump circuit efficiency, which depends on the magnitude of the oscillator signal, is degraded.

Takashima et al describe an arrangement to reduce power consumed by production of internal voltage $V_{int}$ in Low-Power On-Chip Supply Voltage Conversion Scheme for 1G/4G bit DRAMs, 1992 Symposium on VLSI Circuits, Jun. 1992, pp.114–115, and Low-Power On-Chip Supply Voltage Conversion Scheme for Ultrahigh-Density DRAM's, IEEE J. Solid-State Circuits, vol. 28, no. 4, Apr. 1993, pp.504–508. Takashima et al teach operation of two series connected DRAM devices or two series connected halves of one DRAM between external voltage $V_{ext}$ and reference voltage $V_{SS}$ to produce internal voltage $V_{int}$ without the overhead of regulator power consumption. However, internal circuits, such as oscillators and their respective pump circuits, operate at one half of the magnitude of the external voltage $V_{ext}$. Thus, a problem with this method is that pump circuit efficiency, which depends on the magnitude of the oscillator signal, is degraded.

SUMMARY OF THE INVENTION

These problems of reducing power consumption while maintaining pump circuit efficiency are resolved by an oscillator circuit including a reference circuit, responsive to a first voltage, for producing a second voltage. An oscillator, responsive to the second voltage, produces a first output signal having a magnitude that is less than the magnitude of the first voltage. A level translator, responsive to the first output signal, produces a second output signal having a magnitude greater than the magnitude of the first output signal.

The present invention uses an oscillator operating at a voltage less than the supply voltage, thereby conserving power during standby. Pump circuit efficiency is preserved by translating the oscillator output signal to a higher voltage.

BRIEF DESCRIPTION OF THE DRAWINGS

A more complete understanding Of the invention may be gained by reading the subsequent detailed description with reference to the drawings wherein:

FIG. 4 is an oscillator which may be used in the oscillator circuits of FIGS. 1–3 or 6;

FIG. 5A is a level translator which may be used in the oscillator circuits of FIGS. 2, 3 or 6;

FIG. 5B is a level translator which may be used in the oscillator circuits of FIGS. 1, 3 or 6; and FIG. 6 is a diagram of yet another embodiment of the present invention.

DETAILED DESCRIPTION OF THE PREFERRED EMBODIMENTS

Figure 1:
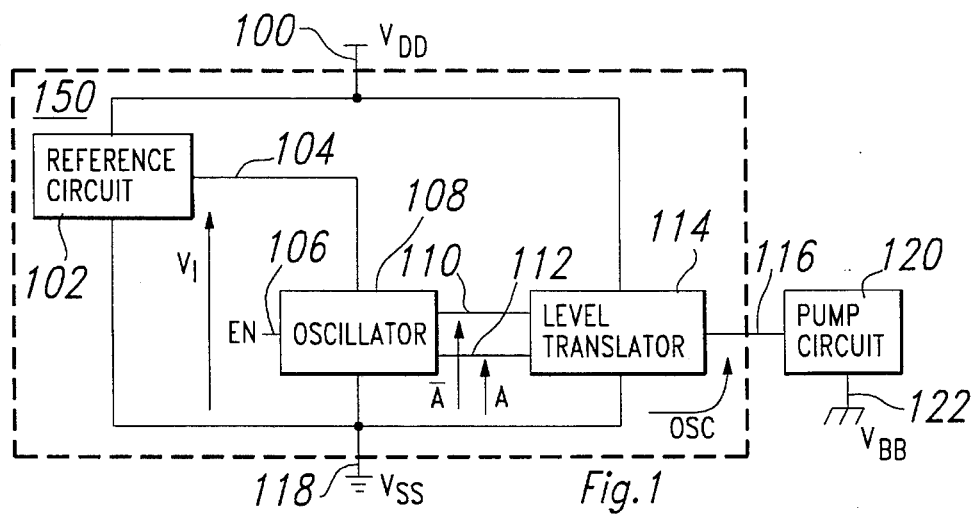
FIG. 1 is a diagram of an embodiment of the present invention.

Referring now to FIG. 1, the oscillator circuit 150 that may be used in a dynamic random access memory will be described in detail. Reference circuit 102 may be a voltage divider or other source as is known to those having ordinary skill in the art. Reference circuit 102 receives a supply voltage $V_{DD}$ and a reference voltage $V_{SS}$ and produces an intermediate voltage $V_I$ at terminal 104. Intermediate voltage $V_I$ has a magnitude that is less than a magnitude of the supply voltage $V_{DD}$. Alternatively, intermediate voltage $V_I$ may be produced by existing reference supplies such as a bit line reference or a dummy cell reference supply. Oscillator 108 receives the intermediate voltage $V_I$ and the reference voltage $V_{SS}$. Oscillator 108 is selectively enabled and disabled by enable signal EN at terminal 106 and produces output signals $\overline{A}$ and A, respectively. Output signals $\overline{A}$ and A are preferably complementary and have magnitudes that are less than the magnitude of the supply voltage $V_{DD}$ and approximately equal to the magnitude of the intermediate voltage $V_I$. Alternatively, oscillator 108 may produce a single output signal, and its complement may be generated within level translator 114, to be described. Thus, an advantage of the present invention is that the power consumed by oscillator 108 is determined by the magnitude of the intermediate voltage $V_I$ and the oscillator current. Since the circuit capacitance of oscillator 108 is substantially independent of intermediate voltage $V_I$, the oscillator current required to operate oscillator 108 decreases with the decreasing magnitude of the intermediate voltage $V_I$. Moreover, since the magnitude of the intermediate voltage $V_I$ is less than the magnitude of the supply voltage $V_{DD}$, there is an advantage that oscillator power consumption is reduced with respect to an oscillator that operates at the supply voltage $V_{DD}$.

Level translator 114 receives the supply voltage $V_{DD}$ and the reference voltage $V_{SS}$. Level translator 114 translates the first and second output signals $\overline{A}$ and A to an output signal OSC at terminal 116. The output signal OSC of the oscillator circuit 150 has a magnitude that is greater than the magnitude of either of the output signals $\overline{A}$ and A, respectively, and approximately equal to the magnitude of the supply voltage $V_{DD}$. The output signal OSC of the oscillator circuit 150 drives a pump circuit 120. The magnitude of the output signal OSC corresponds to the quantity of charge that may be removed by the pump circuit 120 from the substrate at terminal 122 during each cycle of the oscillator circuit. Thus, another advantage of the present invention is that the reduced magnitude of the oscillator output signals $\overline{A}$ and A does not diminish the efficiency of the pump circuit 120 that is driven by the oscillator circuit 150 of FIG. 1.

Figure 2:
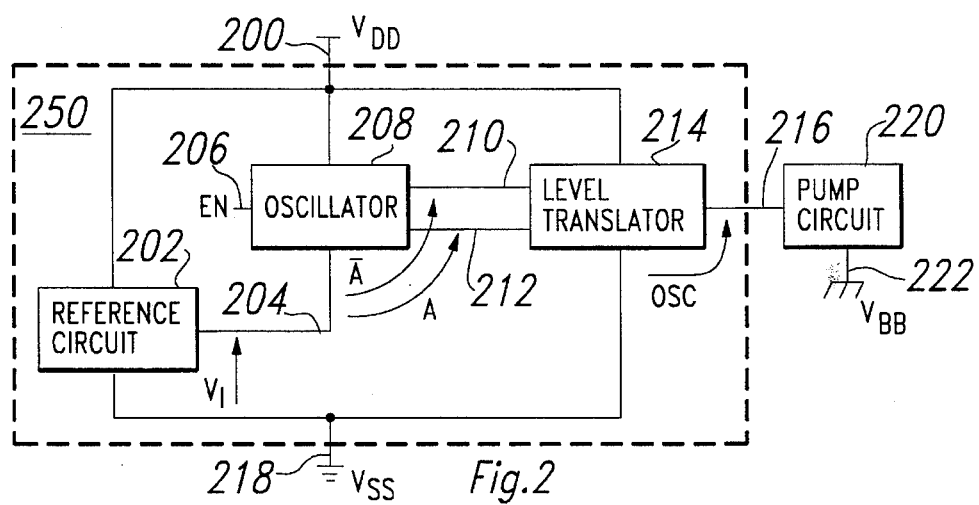
FIG. 2 is a diagram of another embodiment of the present invention.

Referring now to FIG. 2, an oscillator circuit 250 includes a reference circuit 202 which receives a supply voltage $V_{DD}$ and a reference voltage $V_{SS}$ and produces an intermediate voltage $V_I$ at terminal 204, having a magnitude that is less than a magnitude of the supply voltage $V_{DD}$. Oscillator 208 receives supply voltage $V_{DD}$ and the intermediate voltage $V_I$. Oscillator 208 is selectively enabled and disabled by enable signal EN and produces output signals $\overline{A}$ and A, respectively. Each of output signals $\overline{A}$ and A has a magnitude that less than the magnitude of the supply voltage $V_{DD}$ and approximately equal to a magnitude of the difference between the supply voltage $V_{DD}$ and the intermediate voltage $V_I$. Thus, this embodiment of the present invention offers an advantage that the power consumption by oscillator 208 is determined by the oscillator current and the magnitude of the difference between supply voltage $V_{DD}$ and intermediate voltage $V_I$. Since the magnitude of the difference voltage is less than the magnitude of the supply voltage $V_{DD}$, oscillator power consumption is reduced with respect to an oscillator that operates at the supply voltage $V_{DD}$.

Level translator 214 receives the supply voltage $V_{DD}$ and the intermediate voltage $V_I$. Level translator 214 translates output signals $\overline{A}$ and A, respectively, to an output signal OSC at terminal 216. The output signal OSC of the oscillator circuit 150 has a magnitude that is greater than the magnitude of the output signals $\overline{A}$ and A, respectively, and approximately equal to the magnitude of the supply voltage $V_{DD}$. Thus, reduced magnitude of the oscillator output signals $\overline{A}$ and A for this embodiment of the present invention does not diminish the efficiency of a pump circuit 220 that is driven by the oscillator circuit 250 of FIG. 2.

Figure 3:
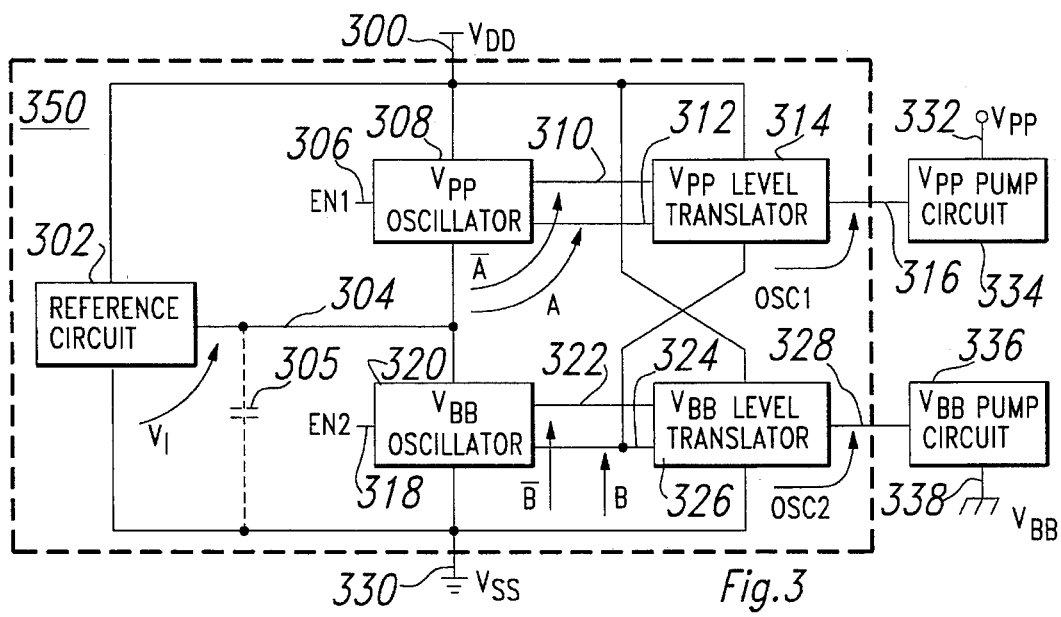
FIG. 3 is a diagram of yet another embodiment of the present invention.

Referring now to FIG. 3, an oscillator circuit 350 includes a reference circuit 302 which receives a supply voltage $V_{DD}$ and a reference voltage $V_{SS}$ and produces an intermediate voltage $V_I$ at terminal 304, having a magnitude that is less than a magnitude of the supply voltage $V_{DD}$. A $V_{PP}$ oscillator 308 receives the supply voltage $V_{DD}$ and the intermediate voltage $V_I$ and produces output signals $\overline{A}$ and A. Thus, the operating voltage of oscillator 308 is a difference between supply voltage $V_{DD}$ and intermediate voltage $V_I$. A $V_{SS}$ oscillator 320 receives the intermediate voltage $V_I$ and reference voltage $V_{SS}$ and produces output signals $\overline{B}$ and B. Thus, the operating voltage of oscillator 320 is a difference between intermediate voltage $V_I$ and reference voltage $V_{SS}$. Oscillators 308 and 320 are each selectively enabled and disabled by enable signals EN1 and EN2, respectively. Alternatively, both oscillators 308 and 320 might be enabled by the same signal. Each output signal from oscillators 308 and 320 has a magnitude less than the magnitude of the supply voltage $V_{DD}$. This embodiment of the present invention offers an advantage that power consumed by each oscillator 308 and 320 is determined by the reduced magnitude of its respective operating voltage and current, thereby reducing power consumption. A further advantage of this embodiment is that current from discharging the circuit capacitance of the oscillator 308 is temporarily stored by a parasitic capacitance 305 at terminal 304 and is consumed in charging the circuit capacitance of the oscillator 320 on the next cycle. Thus, charge is conserved by this embodiment, thereby reducing power consumed by the reference circuit 302. Furthermore, for the case where oscillator current in each of the oscillators 308 and 320 is comparable to the other, reference circuit 302 is not required to establish the intermediate voltage at terminal 304, thereby eliminating power dissipated by reference circuit 302.

Level translators 314 and 326 translate oscillator output signals to output signals OSC1 and OSC2, respectively. Output signals OSC1 and OSC2 each have a magnitude greater than the magnitude of their respective oscillator output signals $\overline{A}$, A and $\overline{B}$, B and approximately equal to the magnitude of the supply voltage $V_{DD}$. Thus, the reduced magnitude of the oscillator output signals $\overline{A}$, A and $\overline{B}$, B does not diminish the efficiency of high voltage $V_{PP}$ and substrate voltage $V_{BB}$ pump circuits 334 and 336, respectively, that may be driven by the oscillator circuit 350 of FIG. 3.

Referring now to FIG. 4, an oscillator 401 that may be used in the oscillator circuits of FIGS. 1–3 and 6 will be described in detail. NAND gate 404 and inverters 408, 412, 416 and 420 are connected between supply voltage terminal 400 and reference voltage terminal 424. Supply voltage terminal 400 corresponds to terminal 104 in FIG. 1, terminal 200 in FIG. 2, either of terminals 300 or 304 in FIG. 3 and either of terminals 600 or 617 in FIG. 6. Reference voltage terminal 424 corresponds to terminal 118 in FIG. 1, terminal 204 in FIG. 2, either of terminals 304 or 330 in FIG. 3 and either of terminals 617 or 630 in FIG. 6.

NAND gate 404 and inverters 408, 412, 416 and 420 are connected in series to provide a total of five signal inversions between an input of NAND gate 404 and output terminal 422 of inverter 420. Output signal O at terminal 422 of inverter 420 is applied to one input of NAND gate 404 so that the complementary oscillator output signals $\overline{O}$ and O will perpetually change states after five gate delays. Input capacitance and drive strength of each gate are designed to set the duration of each gate delay and, therefore, the desired oscillator frequency. Enable signal EN selectively enables and disables the oscillator 401. Alternatively, enable signal EN may be connected to supply voltage $V_X$ at terminal 400 or an inverter may be substituted for NAND gate 404 to permanently enable the oscillator 401.

Referring now to FIG. 5A, a level translator 501 that may be used in oscillator circuits 250, 350 or 650, for level translators 214, 314 or 614 will be described in detail. Common source terminals of p-channel transistors 506 and 516 are connected to supply voltage terminal 500. Common source terminals of n-channel transistors 514 and 524 are connected to reference voltage terminal 530. Supply voltage terminal 500 corresponds to terminal 200 in FIG. 2, terminal 300 in FIG. 3 and terminal 600 in FIG. 6. Reference voltage terminal 530 corresponds to terminal 218 in FIG. 2, terminal 330 in FIG. 3 and terminal 630 in FIG. 6.

Input terminals 502 and 504 receive complementary input signals $\overline{O}$ and O, respectively. Alternatively, the level translator 501 might receive input signal O and produce complementary signal $\overline{O}$ by signal inversion. When input signal O is more positive than input signal $\overline{O}$, for example, n-channel transistor 510 is more conductive than n-channel transistor 520 and p-channel transistor 506 is less conductive than p-channel transistor 516. Thus, the voltage at terminal 518 becomes more positive than the voltage at terminal 508. Consequently, n-channel transistor 514 becomes more conductive than n-channel transistor 524, thereby decreasing the voltage at terminal 512 and increasing the voltage at terminal 522. This feedback effect discharges terminal 508 and turns off n-channel transistor 524. P-channel transistor 516 continues to conduct until output signal OSC at terminal 518 rises to substantially the same voltage level as supply voltage $V_{DD}$ at terminal 500. Alternatively, when the polarity of the input signals $\overline{O}$ and O is reversed, the level translator 501 operates in a complementary manner. When input signal O is less positive than input signal $\overline{O}$, terminal 508 goes high, thereby discharging output terminal 518 through n-channel transistors 520 and 524 to substantially the same voltage level as reference voltage $V_{SS}$ at terminal 530.

Referring now to FIG. 5B, a level translator 551 that may be used in oscillator circuits 150, 350 or 650, for level translators 114, 326 or 626 will be described in detail. Common source terminals of p-channel transistors 556 and 566 are connected to supply voltage terminal 500. Common source terminals of n-channel transistors 564 and 574 are connected to reference voltage terminal 530. Supply voltage terminal 500 corresponds to terminal 100 in FIG. 1, terminal 300 in FIG. 3 and terminal 600 in FIG. 6. Reference voltage terminal 530 corresponds to terminal 118 in FIG. 1, terminal 330 in FIG. 3 and terminal 630 in FIG. 6.

Input terminals 552 and 554 receive complementary input signals $\overline{O}$ and O, respectively. Alternatively, the level translator 551 might receive input signal O and produce complementary signal $\overline{O}$ by signal inversion. When input signal O is more positive than input signal $\overline{O}$, for example, p-channel transistor 560 is less conductive than p-channel transistor 570 and n-channel transistor 564 is more conductive than n-channel transistor 574. Thus, the voltage at terminal 562 becomes less positive than the voltage at terminal 572. Consequently, p-channel transistor 566 becomes more conductive than p-channel transistor 556, thereby increasing the voltage at terminal 568 and decreasing the voltage at terminal 558. This feedback effect increases the voltage at terminal 572 and turns off p-channel transistor 556. P-channel transistor 566 continues to conduct until output signal OSC at terminal 572 rises to substantially the same voltage level as supply voltage $V_{DD}$ at terminal 500. Alternatively, when input signal $\overline{O}$ is more positive than input signal O, terminal 562 goes high, and output terminal 572 is discharged through n-channel transistor 574 to substantially the same voltage level as reference voltage $V_{SS}$ at terminal 530.

Although embodiments of the invention have been described in detail with reference to preferred embodiments, it is to be understood that the foregoing description is by way of examples only and is not to be construed in a limiting sense. For example, oscillator circuit 650 (FIG. 6) illustrates the case where both oscillators 608 and 620 conduct comparable current. Thus, a reference circuit is not required to establish an intermediate voltage $V_I$ at terminal 617. In another embodiment, for example, the oscillators 608 and 620 may be synchronized by substituting output signals OSC1 and OSC2 for enable signals EN2 and EN1, respectively. In yet another embodiment, an additional signal inversion can be added to either of output signals OSC1 or OSC2 to produce phase shifted output signals, for example, OSC1 and $\overline{OSC1}$, that are applied to the pump circuit.

It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:

1. An oscillator circuit comprising:
   a reference circuit, responsive to a first voltage, for producing a second voltage;
   an oscillator, responsive to the second voltage, for producing a first output signal having a magnitude less than a magnitude of the first voltage; and
   a level translator responsive to the first output signal for producing a second output signal having a magnitude greater than the magnitude of the first output signal.

2. An oscillator circuit as in claim 1, wherein the magnitude of the first voltage is approximately equal to the magnitude of the second output signal.

3. An oscillator circuit as in claim 2, wherein the magnitude of the first output signal is approximately equal to one half of the magnitude of the first voltage.

4. An oscillator circuit as in claim 1, wherein the first output signal comprises complementary signals.

5. An oscillator circuit comprising:
   a reference circuit, responsive to a first voltage, for producing a second voltage;
   an oscillator, responsive to the first voltage and the second voltage, for producing a first output signal having a magnitude less than a magnitude of the first voltage; and
   a level translator responsive to the first output signal for producing a second output signal having a magnitude greater than the magnitude of the first output signal.

6. An oscillator circuit as in claim 5, wherein the magnitude of the first voltage is approximately equal to the magnitude of the second output signal.

7. An oscillator circuit as in claim 6, wherein the magnitude of the first output signal is approximately equal one half the magnitude of the first voltage.

8. An oscillator circuit as in claim 5, wherein the first output signal comprises complementary signals.

9. An oscillator circuit comprising:
   a first oscillator, responsive to a first voltage and a second voltage, for producing a first output signal having a magnitude less than a magnitude of the first voltage;
   a second oscillator, responsive to the second voltage and a reference voltage for producing a second output signal having a magnitude less than the magnitude of the first voltage;
   a first level translator responsive to the first output signal for producing a third output signal having a magnitude greater than the magnitude of the first output signal; and
   a second level translator responsive to the second output signal for producing a fourth output signal having a magnitude greater than the magnitude of the second output signal.

10. An oscillator as in claim 9, wherein the magnitude of the first output signal is approximately equal to a magnitude of a difference between the first voltage and the second voltage and the magnitude of the second output signal is approximately equal to a magnitude of a difference between the second voltage and the reference voltage.

11. An oscillator as in claim 9, wherein the magnitude of the third output signal and the magnitude of the fourth output signal are approximately equal to the magnitude of the first voltage.

12. An oscillator circuit as in claim 9, wherein at least one of the first and second output signals comprises complementary signals.

13. An oscillator as in claim 9, further comprising a reference circuit, responsive to the first voltage for producing the second voltage.

14. An oscillator circuit as in claim 9, wherein the third output signal is in phase with the fourth output signal.

15. An oscillator circuit as in claim 9, wherein the third output signal is phase shifted with respect to the fourth output signal.

16. A method of reducing power consumption in a semiconductor device, including the steps of:
  powering an oscillator circuit with a first voltage;
  producing a first output signal at an output terminal of the oscillator circuit;
  powering a level translating circuit with a second voltage, the second voltage having a magnitude greater than a magnitude of the first output signal; and
  producing a second output signal at an output terminal of the level translating circuit in response to the first output signal, the second output signal having a magnitude greater than the magnitude of the first output signal.

17. The method of claim 16 further including the steps of:
  powering a reference circuit with the second voltage; and
  producing the first voltage at an output terminal of the reference circuit.

18. The method of claim 17 wherein the magnitude of the first output signal is approximately equal to a magnitude of the first voltage.

19. The method of claim 18 wherein the magnitude of the first output signal is approximately equal to one half of the magnitude of the second output signal.

20. A method of generating a supply voltage for an integrated circuit, including the steps of:
  powering an oscillator circuit with a first voltage;
  producing a first output signal at an output terminal of the oscillator circuit;
  powering a level translating circuit with a second voltage, the second voltage having a magnitude greater than a magnitude of the first output signal; and
  producing a second output signal at an output terminal of the level translating circuit in response to the first output signal, the second output signal having a magnitude greater than the magnitude of the first output signal.

21. The method of claim 20 further including the steps of:
  powering a pump circuit with the second voltage; and
  producing the supply voltage at an output terminal of the pump circuit in response to the second output signal.

22. The method of claim 21 further including the steps of:
  powering a reference circuit with the second voltage; and
  producing the first voltage at an output terminal of the reference circuit.

23. The method of claim 21 wherein the supply voltage is negative with respect to the second voltage.

24. The method of claim 23 wherein the supply voltage is a substrate voltage.

25. The method of claim 24 further including the step of producing the second output signal in response to a first state of an enable signal and not producing the second output signal in response to a second state of the enable signal.

26. The method of claim 21 wherein the supply voltage is positive with respect to the second voltage.

27. The method of claim 26 wherein the supply voltage is a high voltage.

28. The method of claim 27 further including the step of producing the second output signal in response to a first state of an enable signal and not producing the second output signal in response to a second state of the enable signal.

29. A method of reducing power consumption in an integrated circuit, including the steps of:
  connecting a plurality of oscillator circuits in series between a supply voltage terminal and a reference terminal, each oscillator circuit having an output terminal;
  applying a first voltage between the supply voltage terminal and the reference terminal;
  operating the plurality of oscillator circuits in response to the first voltage; and
  producing an oscillator output signal at each output terminal.

30. The method of claim 29 further including the steps of:
  powering a level translator circuit with a second voltage;
  producing a translated output signal at an output terminal of the level translator circuit in response to the at least one oscillator output signal, the translated output signal having a magnitude that is greater than a magnitude of the at least one oscillator output signal.

31. The method of claim 30 further including the steps of:
  powering a pump circuit with the second voltage;
  producing the supply voltage at an output terminal of the pump circuit in response to the translated output signal.

32. The method of claim 31 wherein the supply voltage is a substrate voltage.

33. The method of claim 31 wherein the supply voltage is a high voltage.

34. The method of claim 31 further including the step of producing the translated output signal in response to a first state of an enable signal and not producing the translated output signal in response to a second state of the enable signal.

35. The method of claim 31 further including the step of producing the oscillator output signal in response to a first state of an enable signal and not producing the oscillator output signal in response to a second state of the enable signal.

* * * * *